US009472459B2

(12) United States Patent
Kirihara

(10) Patent No.: US 9,472,459 B2
(45) Date of Patent: Oct. 18, 2016

(54) WAFER DIVIDER AND WAFER DIVISION METHOD

(71) Applicant: DISCO CORPORATION, Tokyo (JP)

(72) Inventor: Naotoshi Kirihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/046,672

(22) Filed: Feb. 18, 2016

(65) Prior Publication Data

US 2016/0247723 A1    Aug. 25, 2016

(30) Foreign Application Priority Data

Feb. 20, 2015   (JP) ................................. 2015-031540

(51) Int. Cl.
H01L 21/70     (2006.01)
H01L 21/78     (2006.01)
B28D 5/00      (2006.01)

(52) U.S. Cl.
CPC ............ H01L 21/78 (2013.01); B28D 5/0011 (2013.01); B28D 5/0029 (2013.01); B28D 5/0052 (2013.01)

(58) Field of Classification Search
CPC ........................ H01L 21/71; H01L 21/67092
See application file for complete search history.

(56) References Cited

U.S. PATENT DOCUMENTS

2006/0035411 A1*   2/2006   Oba .................. B23K 26/0736
                                                    438/113

FOREIGN PATENT DOCUMENTS

JP          2010-135484          6/2010

* cited by examiner

Primary Examiner — Mohammad Choudhry
(74) Attorney, Agent, or Firm — Greer Burns & Crain, Ltd.

(57) ABSTRACT

A divider which divides a wafer having a division start points formed along the scheduled divisions into a plurality of device chips. The divider includes a placement table on which a wafer is placed, and division unit adapted to divide the wafer on the placement table into a plurality of device chips starting from the division start points. The placement table includes: a plurality of spherical bodies having the same diameter; a container that accommodates the plurality of spherical bodies in close contact with each other; and a placement surface formed by connecting vertices of spherical surfaces of the plurality of spherical bodies that are accommodated in close contact with each other.

3 Claims, 6 Drawing Sheets

WAFER DIVIDER AND WAFER DIVISION METHOD

BACKGROUND OF THE INVENTION

1. Field of the Invention

The present invention relates to a divider for dividing a wafer and a wafer division method.

2. Description of the Related Art

One way of dividing a wafer, having a plurality of devices such as ICs or LSIs partitioned by scheduled division lines and formed on the front face thereof into individual device chips, is achieved by forming division start points along the scheduled division lines and pressing a cutting blade against the division start points for division along the scheduled division lines (refer, for example, to Japanese Patent Laid-Open No. 2010-135484).

SUMMARY OF THE INVENTION

However, if a wafer is divided into chips whose outer shape is hexagonal, octagonal, or dodecagonal rather than quadrangular, the scheduled division lines are not unidirectionally linear because of the chip shape. Therefore, a wafer cannot be divided simply by pressing a cutting blade. Further, if a wafer is divided into chips whose outer shape is dodecagonal, unnecessary triangular waste pieces surrounded by three dodecagonal chips are formed, adding another cause of difficulty in division.

In light of the foregoing, it is an object of the present invention to provide a divider for dividing a wafer and a wafer division method that allow for formation of polygonal chips by pressing a cutting blade against a wafer and dividing the wafer along scheduled division lines.

In accordance with an aspect of the present invention, there is provided a divider that includes a placement table and division means. A wafer is placed on the placement table. The wafer has a device formed in each of areas partitioned by scheduled division lines, with division start points formed along the scheduled division lines. The division means divides the wafer on the placement table into a plurality of device chips starting from the division start points. The placement table includes a plurality of spherical bodies having same diameter, a container that accommodates the plurality of spherical bodies in close contact with each other, and a placement surface formed by connecting vertices of spherical surfaces of the plurality of spherical bodies that are accommodated in close contact with each other. The division means includes pressing means, elevating means, and parallel movement means. The pressing means presses the wafer placed on the placement surface toward the placement surface. The elevating means raises or lowers the pressing means. The parallel movement means moves the pressing means and the placement table relatively parallel along the placement surface. The divider divides the wafer on the placement table into individual device chips by pressing the wafer with the pressing means.

In accordance with another aspect of the present invention, there is provided a wafer division method of dividing a wafer, having division start points formed along scheduled division lines, into individual device chips starting from the division start points using the divider of claim 1. The wafer division method includes an adhesive tape affixing step, a placement step, and a division step. The adhesive tape affixing step affixes an adhesive tape to a rear face of the wafer. The placement step places, on the placement table, the wafer to which the adhesive tape has been affixed. The division step divides the wafer placed on the placement table into individual device chips starting from the division start points by pressing the wafer toward the placement surface with the pressing means via the adhesive tape.

In the above wafer division method, a sheet is preferably arranged between the placement surface and a bottom face of the wafer on the placement surface in the placement step.

Further, in the above wafer division method, the division step preferably includes a wafer movement step that moves the wafer on the placement surface parallel to the placement surface while at same time pressing the wafer with the pressing means.

The wafer divider of the present invention supports a wafer on vertices of a plurality of spherical bodies making up a placement surface. This provides a small contact area between the wafer front face and the placement surface. As a result, a drag force from the placement surface is transferred, without dissipation, to the division start points formed inside the wafer, thus producing cracks in the wafer from the division start points along the thickness and dividing the wafer into a plurality of polygonal device chips.

The wafer division method of the present invention uses the divider and includes the adhesive tape affixing step, the placement step, and the division step. The adhesive tape affixing step affixes an adhesive tape to the rear face of a wafer on which the division start points are formed along the scheduled division lines. The placement step places, on the placement table, the wafer to which the adhesive tape has been affixed. The division step divides the wafer on the placement table into individual device chips starting from the division start points by pressing the wafer toward the placement surface with a pressing section via the adhesive tape. This allows for accurate division of the wafer along the scheduled division lines into polygonal chips.

Preferably, a sheet is arranged between the placement surface and the bottom face of the wafer on the placement surface, thus preventing damage to the front face of the wafer by the spherical bodies during pressing.

Preferably, the wafer division method includes the wafer movement step that moves the wafer on the placement surface parallel to the placement surface while at the same time pressing the wafer with the pressing section. As a result, for example, if the entire rear face of the wafer is pressed with the pressing means first, followed by pressing of the wafer with the pressing means again after moving the wafer parallel to change the contact positions between the wafer front face and the placement surface (contact positions with the vertices of the plurality of spherical bodies), a sufficient force is applied to those division start points to which such a force has yet to be applied, thus permitting more certain division.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
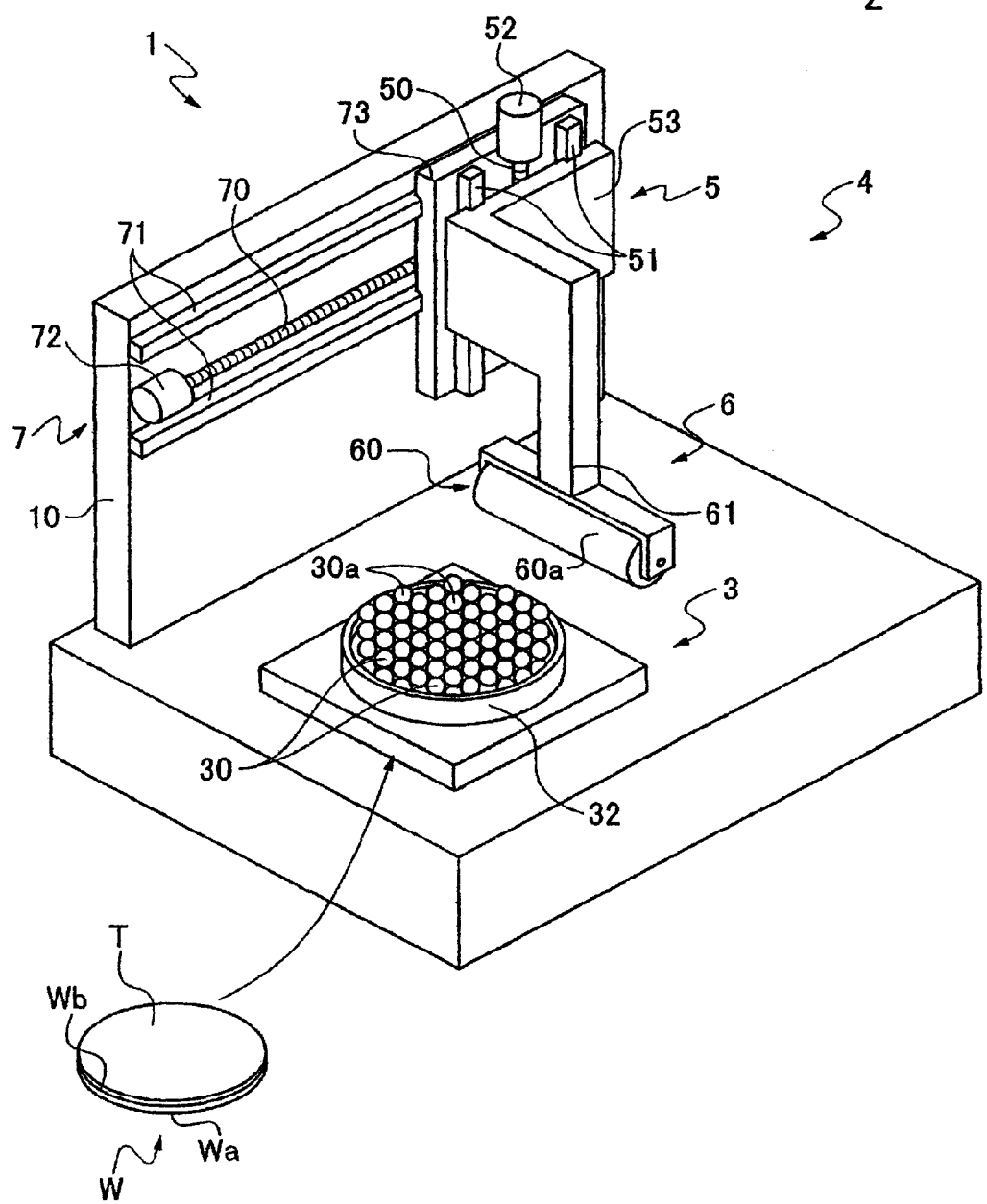
FIG. 1 is a perspective view illustrating an example of the appearance of a divider.
Figure 2:
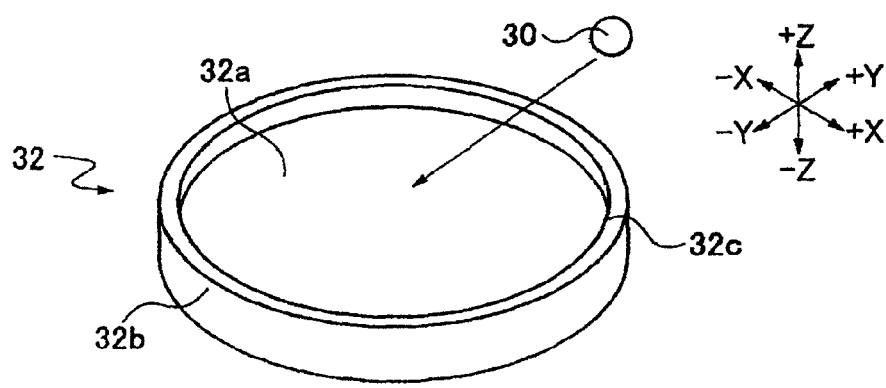
FIG. 2 is a perspective view of a container and a spherical body arranged in the container.

A divider 1 illustrated in FIG. 1 divides a wafer W, placed on a placement table 3, into a plurality of chips with division means 4. As illustrated in FIG. 1, the placement table 3 is arranged on the divider 1. The placement table 3 includes a plurality of spherical bodies 30 and a container 32 that accommodates the plurality of spherical bodies 30 in close contact with each other. The container 32 illustrated in FIG. 2 includes, for example, a bottom plate 32a and a side plate 32b. The bottom plate 32a has an outer shape in the form of a disk. The side plate 32b rises vertically in the positive Z direction from the peripheral portion. The plurality of spherical bodies 30 can be arranged in a plurality of spaces having the same diameter surrounded by the bottom plate 32a and the side plate 32b. It should be noted that the outer shape of the bottom plate 32a is not limited to a disk shape and may be, for example, quadrangular.

Figure 3:
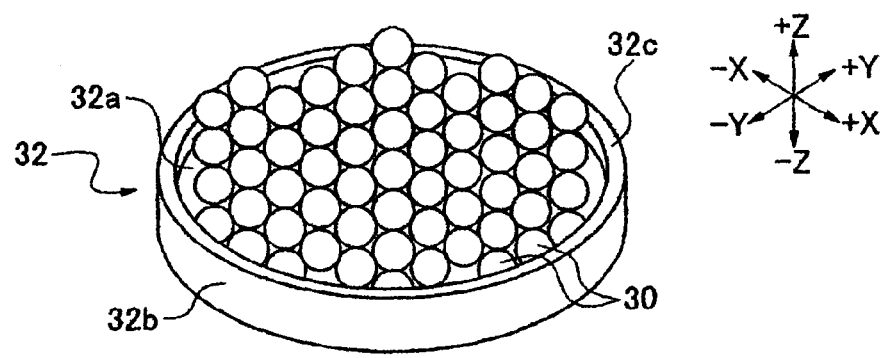
FIG. 3 is a perspective view of a placement table.

As illustrated in FIG. 3, the plurality of spherical bodies 30 are arranged rotatably in the spaces surrounded by the bottom plate 32a and the side plate 32b of the container 32 in such a manner as to be in close contact with each other. The spherical bodies 30 are pseudo true spheres made, for example, of plastic with a smoothed surface. That is, in the present embodiment, the six spherical bodies 30 are provided around and in contact with the one spherical body 30 on the bottom plate 32a. In the container 32, the spaces surrounded by the bottom plate 32a and the side plate 32b in the above layout are filled with the plurality of spherical bodies 30. It should be noted that the number and layout of spherical bodies 30 can be changed as appropriate depending on the type of the spherical bodies 30, the wafer type, the shape of the portions partitioned by the scheduled division lines, and the chip size after division or the container size. It should be noted that the spherical bodies 30 may be fastened to the bottom plate 32a and arranged in the container 32.

Figure 4:
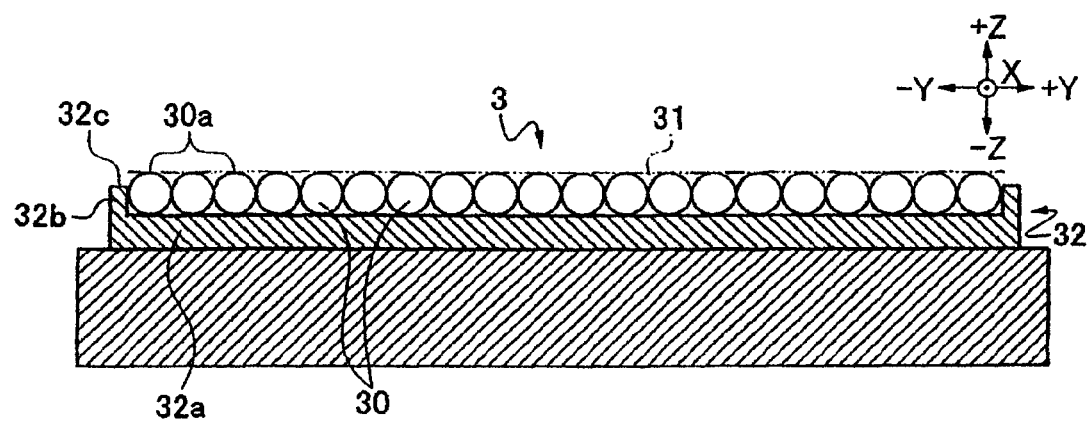
FIG. 4 is a sectional view of the placement table.

In the present embodiment shown in FIGS. 1 to 4 and 6 to 9, the plurality of spherical bodies 30 are pseudo true spheres. However, the spherical bodies 30 may be true spheres, oblate spheroids, pseudo oblate spheroids, prolate spheroids, pseudo prolate spheroids, or hemispheres in addition to pseudo true spheres and may be made of aluminum or other metal in addition to plastic. The plurality of spherical bodies 30 are uniform in size and, for example, about 3 mm to 6 mm in diameter, and larger than each of the chips manufactured by dividing a wafer. The size thereof can be changed as appropriate depending on the type of the spherical bodies 30, the wafer type, the shape of the portions partitioned by the scheduled division lines, and the chip size after division. Further, the spherical bodies 30 are preferably sized so that when the spherical bodies 30 are arranged on the placement table 3 as illustrated in FIG. 4, vertices 30a, the highest points, of the spherical bodies 30, are higher (in the positive Z direction) than the position of a top face 32c of the side plate 32b in the vertical direction (Z-axis direction). It should be noted that the vertices 30a are where the surfaces of the spherical bodies 30 are maximal in the positive Z direction when the spherical bodies 30 are arranged on the placement table 3.

A placement surface 31 illustrated in FIG. 4 is a virtual surface formed by connecting the vertices 30a of the surfaces of the plurality of spherical bodies 30 that are accommodated in the container 32 in close contact with each other. The placement surface 31 is a level surface because the plurality of spherical bodies 30 are uniform in size and the positions of the vertices 30a thereof in the Z-axis direction are the same.

The division means 4 illustrated in FIG. 1 includes a pressing section 6, elevating means 5, and parallel movement means 7. The pressing section 6 presses the wafer W, placed on the placement surface 31, toward the placement surface 31. The elevating means 5 raises or lowers the pressing section 6. The parallel movement means 7 moves the pressing section 6 and the placement table 3 relatively parallel along the placement surface 31.

As illustrated in FIG. 1, a wall section 10 is arranged upright on the back in the negative X direction on the divider 1, with the parallel movement means 7 arranged on the wall section 10. The parallel movement means 7 includes a ball screw 70, a pair of guide rails 71, a motor 72, and a movable plate 73. The ball screw 70 has an axial center that extends in the Y-axis direction. The guide rails 71 are arranged parallel to the ball screw 70. The motor 72 rotates the ball screw 70. The movable plate 73 has an internal nut that is screwed onto the ball screw 70 and a side portion that comes into sliding contact with the guide rails 71. When the motor 72 rotates the ball screw 70, the movable plate 73 is guided by the guide rails 71 to move reciprocally in the Y-axis direction, thus moving the pressing section 6 and the placement table 3 relatively parallel along the placement surface 31. Then, the elevating means 5 is arranged on the movable plate 73.

The elevating means 5 includes a ball screw 50, a pair of guide rails 51, a motor 52, and an elevating section 53. The ball screw 50 has an axial center that extends in the Z-axis direction. The guide rails 51 are arranged parallel to the ball screw 50. The motor 52 rotates the ball screw 50. The elevating section 53 has an internal nut that is screwed onto the ball screw 50 and a side portion that comes into sliding contact with the guide rails 51. When the motor 52 rotates the ball screw 50, the elevating section 53 is guided by the guide rails 51 to move reciprocally in the Z-axis direction, thus pressing the wafer with the pressing section 6. Then, the pressing section 6 is arranged on the elevating section 53.

The pressing section 6 includes a roller 60 and a support section 61. The roller 60, for example, has a cylindrical outer shape and an axial center that extends in the X-axis direction. The support section 61 rotatably supports the roller 60 and is connected to the elevating section 53. A roller surface 60a of the roller 60 that comes in contact with the wafer is formed, for example, with urethane rubber. Then, even if some sides and edges of the chips produced by cracking of the wafer as a result of pressing of the roller 60 against the wafer are formed in such a manner as to flip up and stick into the roller surface 60a, the roller surface 60a absorbs such sides and edges of the chips thanks to flexible urethane rubber, thus allowing a pressure to be applied evenly to a rear face Wb of the wafer. The roller surface 60a can be used a plurality of times thanks to the abrasion resistance and restoring capability of urethane rubber. The roller 60 is preferably sized, for example, so that the entire placement surface 31 is pressed by a round-trip movement of the pressing section 6 in the Y-axis direction. It should be noted that the material with which the roller surface 60a is formed is not limited to urethane rubber, and that the roller surface 60a may be formed with silicone rubber. Further, a urethane rubber plate may be used rather than the roller 60 depending on the type of the spherical bodies 30, the wafer type, the shape of the portions partitioned by the scheduled division lines, and the chip size after division or the container size.

Figure 6:
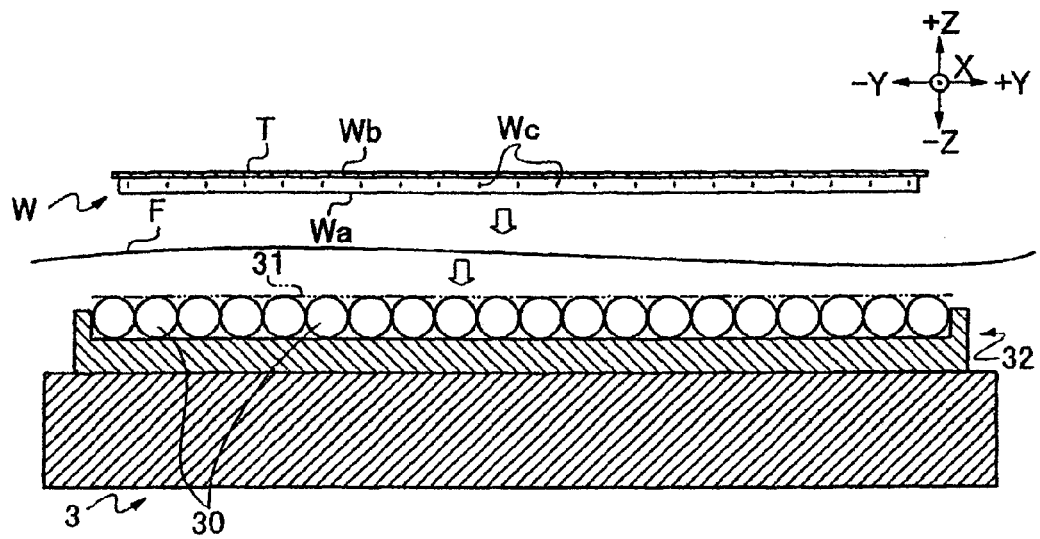
FIG. 6 is a sectional view illustrating the manner in which the wafer to which an adhesive tape has been affixed is placed on the placement table in a placement step.
Figure 7:
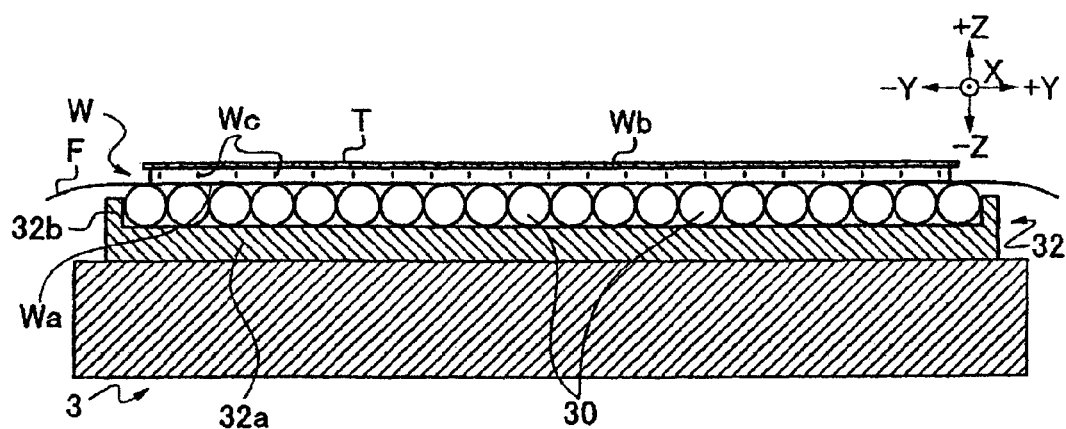
FIG. 7 is a sectional view illustrating the manner in which the wafer to which an adhesive tape has been affixed rests on the placement table in the placement step.
Figure 8:
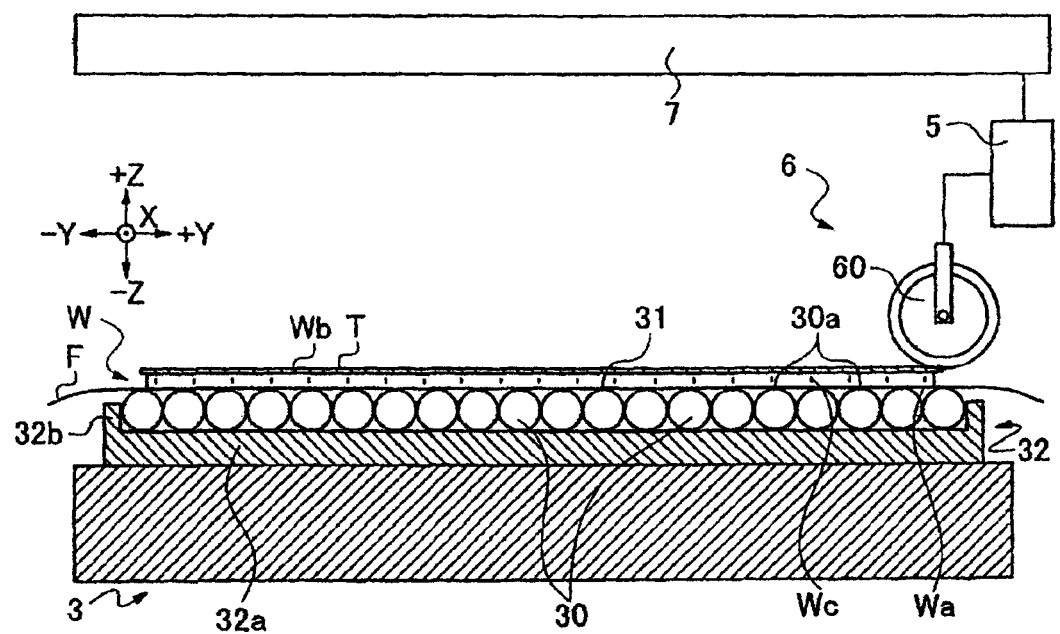
FIG. 8 is a sectional view illustrating the manner in which the wafer is pressed toward the placement surface with a pressing section in a division step.
Figure 9:
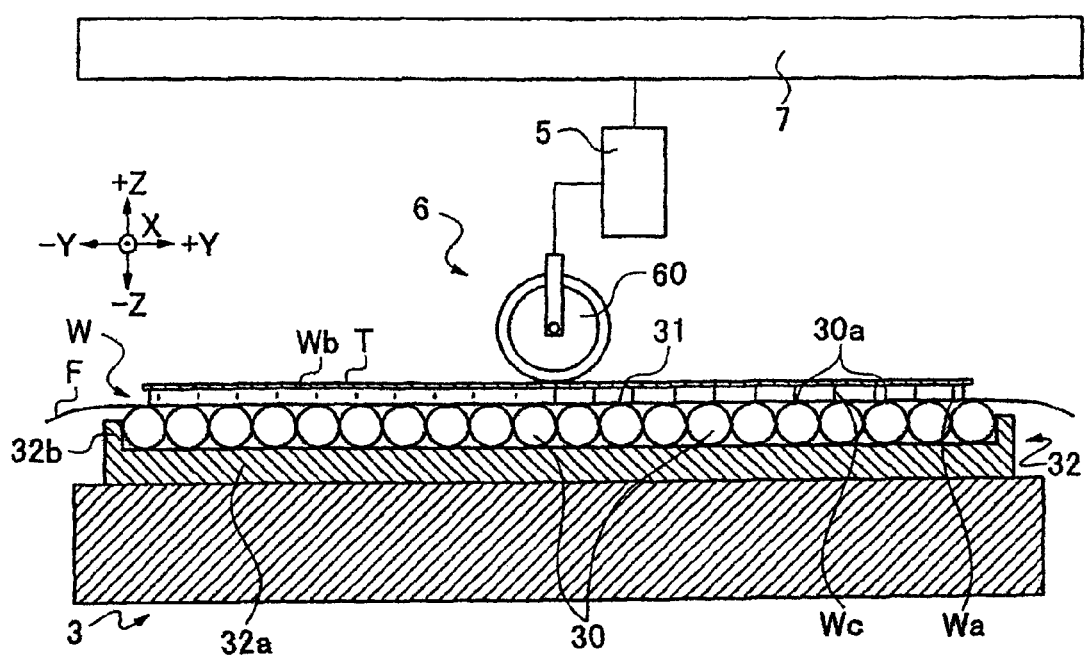
FIG. 9 is a sectional view illustrating the manner in which the wafer is divided starting from division start points as a result of pressing of the wafer toward the placement surface with the pressing section.

A description will be given below of the operation of the divider 1 and the division method when the wafer W illustrated in FIG. 1 is divided by the divider 1 with reference to FIGS. 1 to 9. It should be noted that FIGS. 8 and 9 depict the components of the division means 4 in a simplified manner. Further, the spherical bodies 30 provided on the placement table 3 are pseudo true spheres of 6 mm in diameter.

Figure 5:
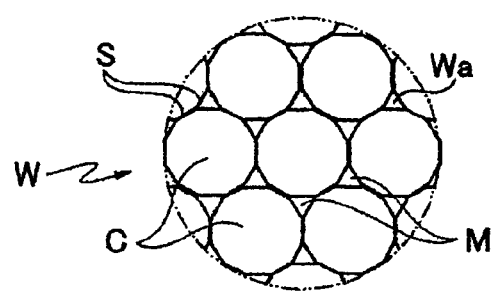
FIG. 5 is a partially enlarged plan view of a wafer front face.

The wafer W illustrated in FIG. 1 is, for example, a semiconductor wafer whose outer shape is circular, with an adhesive tape T affixed to the rear face Wb of the wafer. Further, division start points Wc are formed along scheduled division lines in the wafer W as illustrated in FIG. 6. Then, a device (not depicted) is formed in each of a plurality of dodecagonal areas partitioned by scheduled division lines S on a front face Wa of the wafer as illustrated in FIG. 5. Then, the division of the wafer W allows for manufacture of a number of dodecagonal chips C. At the same time, triangular waste pieces M are produced. It should be noted that the outer shape of the wafer W is not limited to circular, and that the type of the wafer W is not limited to a semiconductor wafer. Further, the polygonal areas partitioned by the scheduled division lines S on the front face Wa of the wafer are not limited to being dodecagonal. Instead, these areas may be hexagonal, octagonal, or in other shape. The division start points Wc are modified layers formed, by irradiating the laser beam and concentrating into the scheduled division lines S of the wafer W, inside the wafer W along the scheduled division lines S. In addition to modified layers, the division start points Wc may be abrasion grooves formed on the wafer surface, half-cut grooves formed on the wafer surface by cutting, or scribe grooves.

(1) Adhesive Tape Affixing Step

First, an adhesive tape affixing step is performed in which the adhesive tape T is affixed to the rear face Wb of the wafer W illustrated in FIG. 6. In the adhesive tape affixing step, the affixing face of the adhesive tape T is brought face to face with the rear face Wb of the wafer first for alignment. The entire periphery of the adhesive tape T preferably lies outside the edge of the wafer W during alignment.

After the alignment, the entire rear face Wb of the wafer is affixed to the adhesive tape T to complete the adhesive tape affixing step. As a result, the adhesive tape T is affixed to the rear face Wb of the wafer as illustrated in FIG. 6. It should be noted that, for example, the peripheral portion of the adhesive tape T may be affixed to an annular frame after the affixation of the rear face Wb of the wafer to the adhesive tape T so that the wafer W is supported by the annular frame via the adhesive tape T.

(2) Placement Step

After the adhesive tape affixing step, a placement step is performed in which the wafer W to which the adhesive tape T has been affixed is placed on the placement surface 31 of the placement table 3. In the placement step, for example, a sheet F made of resin is brought face to face with the placement surface 31 of the placement table 3 first so that the entire periphery of the sheet F lies outside the edge of the wafer W during alignment. It should be noted that the sheet F is made, for example, of polyethylene resin, polypropylene resin, or vinyl chloride resin. Further, silicon-coated release film or release paper, for example, may be used in place of the sheet F. Still further, the sheet F may have an adhesive face so that the wafer W sticks thereto.

After the alignment between the sheet F and the placement surface 31, the sheet F is placed on the placement surface 31. Next, the front face Wa of the wafer W to which the adhesive tape T has been affixed is brought face to face with the placement surface 31 on which the sheet F rests for alignment. Then, the wafer W is placed on the placement surface 31. As a result, the wafer W rests on the placement surface 31 with the sheet F arranged between the placement surface 31 and the bottom face of the wafer W (front face Wa of the wafer) as illustrated in FIG. 7. That is, the wafer W is supported on the vertices 30a of the surfaces of the plurality of spherical bodies 30 in close contact with each other.

(3) Division Step

After the placement step, a division step is performed in which the wafer W is divided starting from the division start points Wc by pressing the wafer toward the placement surface 31 with the pressing section 6 via the adhesive tape T as illustrated in FIGS. 8 and 9.

In the division step, first the elevating means 5 lowers the pressing section 6 in the negative Z direction to the height where the roller 60 of the pressing section 6 comes into contact with the tape T affixed to the rear face Wb of the wafer to press the tape T as illustrated in FIG. 8. After the pressing section 6 has lowered to the given height, the parallel movement means 7 moves the elevating means 5 parallel in the negative Y direction, thus allowing the pressing section 6 to press the wafer W toward the placement surface 31.

As the wafer W is pressed toward the placement surface 31 with the pressing section 6 via the adhesive tape T as illustrated in FIG. 9, a drag force against the pressure applied by the pressing section 6 is transferred from the vertices 30a of the surfaces of the plurality of spherical bodies 30 in close contact with each other to the division start points Wc formed along the scheduled division lines inside the wafer W. As a result, cracks are produced starting from the division start points Wc along the thickness of the wafer W (in the Z-axis direction), thus dividing the wafer W.

If the wafer W still has areas that have yet to be divided after the parallel movement means 7 has finished moving the pressing section 6 parallel on the rear face Wb of the wafer up to a given position in the negative Y direction, the wafer W is pressed toward the placement surface 31 with the pressing section 6 by moving the pressing section 6 parallel in the positive Y direction, completely dividing the wafer W into individual chips. It should be noted that after the parallel movement means 7 has moved the pressing section 6 parallel on the rear face Wb of the wafer up to a given position in the negative Y direction for pressing the entire rear face Wb of the wafer, the elevating means 5 may move the pressing section 6 in the positive Z direction to separate the pressing section 6 from the wafer W, followed by parallel movement of the pressing section 6 by the parallel movement means 7 in the positive Y direction to the original position and repetition of similar division again.

(4) Wafer Movement Step

In the division step, a wafer movement step is also performed in which the wafer W on the placement surface 31 is moved parallel to the placement surface 31 while at the same time pressing the wafer W with the pressing section 6. In the wafer movement step, for example, the wafer W is moved, for example, by an operator parallel to the placement surface 31 while the wafer W is pressed toward the placement surface 31 with the pressing section 6, thus changing the contact positions between the front face Wa of the wafer and the placement surface 31. It should be noted that, in the wafer movement step, the entire rear face Wb of the wafer may be pressed temporarily with the pressing section 6 followed by the parallel movement of the wafer W to change the contact positions between the front face Wa of the wafer and the placement surface 31 and pressing of the wafer again with the pressing section 6.

Alternatively, the wafer W may be rotated to change the contact positions between the front face Wa of the wafer W and the placement surface 31. For example, if the chips into which the wafer is to be divided are hexagonal, the wafer W may be rotated around the center thereof 60 degrees, followed by lowering of the pressing section 6 for pressing, traveling of the pressing section 6 in the positive Y direction, rotation of the wafer W again 60 degrees, and traveling of the pressing section 6 in the negative Y direction. That is, if the polygon is made up of an even number of angles, the number of rotations is equal to (number of angles/2)−1. It should be noted that the wafer W should be moved parallel to the placement surface 31 in a direction orthogonal to a side of the chip.

In the present division method using the divider 1, the wafer W is supported on the vertices 30a of the surfaces of the plurality of spherical bodies 30 making up the placement surface 31. This provides a small contact area between the front face Wa of the wafer and the placement surface 31. As a result, a drag force from the placement surface 31 is transferred, without dissipation, to the division start points Wc formed inside the wafer W along the scheduled division lines S in the front face Wa of the wafer illustrated in FIG. 5. Therefore, when the wafer W is pressed toward the placement surface 31 with the pressing section 6, cracks are produced in the wafer W from the division start points Wc along the thickness, thus making it possible to precisely divide the wafer W into the dodecagonal device chips C and the triangular waste pieces M illustrated in FIG. 5.

Further, in the placement step of the present division method, the sheet F is arranged between the placement surface 31 and the bottom face of the wafer W (front face Wa of the wafer) on the placement surface 31, thus preventing damage to the chips C caused by the spherical bodies 30 after the division.

Further, in the division step of the present division method, the wafer movement step is performed in which the wafer W on the placement surface 31 is moved parallel to the placement surface 31 while at the same time pressing the wafer W with the pressing section 6. This changes the contact positions between the front face Wa of the wafer and the vertices 30a of the plurality of spherical bodies 30, thus ensuring that a sufficient pressure is applied even to those division start points Wc to which such a pressure has yet to be applied and allowing for more certain division of the wafer W into the chips C and the waste pieces M.

It should be noted that the present invention is not limited to the above embodiment. For example, even if the wafer W is divided into hexagonal chips, and if the spherical bodies 30 provided on the placement table 3 are oblate spheroids or prolate spheroids, the present invention allows for accurate division of the wafer W into hexagonal chips. Further, for example, in the division step, the wafer W may be coarsely divided temporarily using the placement table 3 having the spherical bodies 30 that are pseudo true spheres of 6 mm in diameter, followed by changing the placement table 3 from the one having the plurality of spherical bodies 30 that are pseudo true spheres of 6 mm in diameter to the one having the spherical bodies 30 that are pseudo true spheres of 2.5 mm in diameter and finely dividing the wafer W. In this case, it is easier to divide the wafer W into the dodecagonal device chips C and the triangular waste pieces M.

Further, the present invention permits effective division into chips even when the chips are made up of an odd number of angles such as triangles or pentagons. For example, if the chips are pentagonal, the wafer W can be readily divided by rotating the wafer W 72 degrees at least four times and pressing the wafer W with the pressing section 6. That is, if the polygon is made up of an odd number of angles, the number of rotations is equal to (number of angles−1).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer division method of dividing a wafer, having division start points formed along scheduled division lines, into individual device chips starting from the division start points using a wafer divider, the wafer divider comprising:
   a placement table; and division means adapted to divide the wafer on the placement table into a plurality of device chips starting from the division start points,
   wherein the placement table includes a plurality of spherical bodies having same diameter, a container that accommodates the plurality of spherical bodies in close contact with each other, and a placement surface formed by connecting vertices of spherical surfaces of the plurality of spherical bodies that are accommodated in close contact with each other, and
   the division means includes
      pressing means adapted to press the wafer placed on the placement surface toward the placement surface, elevating means adapted to raise or lower the pressing means, and parallel movement means adapted to move the pressing means and the placement table relatively parallel along the placement surface,
   the wafer division method including
   an adhesive tape affixing step of affixing an adhesive tape to a rear face of the wafer,
   a placement step of placing, on the placement table, the wafer to which the adhesive tape has been affixed, and
   a division step of dividing the wafer placed on the placement table into individual device chips starting from the division start points by pressing the wafer toward the placement surface with the pressing means via the adhesive tape.

2. The wafer division method of claim 1, further comprising:
   a sheet arrangement step of arranging a sheet between the placement surface and a bottom face of the wafer on the placement surface before the placement step.

3. The wafer division method of claim 1,
   wherein the division step includes a wafer movement step of moving the wafer on the placement surface parallel to the placement surface while at same time pressing the wafer with the pressing means.

* * * * *